United States Patent [19]
Gaumet

[11] Patent Number: 5,639,556
[45] Date of Patent: Jun. 17, 1997

[54] CONDUCTIVE INK

[75] Inventor: Michel Gaumet, Saint Denis en Val, France

[73] Assignee: Solaic, Puteaux, France

[21] Appl. No.: 544,320

[22] Filed: Oct. 17, 1995

[30] Foreign Application Priority Data

Oct. 19, 1994 [FR] France ................... 94 12470

[51] Int. Cl.⁶ ........................................ B22F 7/08
[52] U.S. Cl. .................. 428/568; 428/548; 75/252; 252/510
[58] Field of Search ............. 75/252; 106/20 B; 252/510, 514; 428/568, 539.5

[56] References Cited

U.S. PATENT DOCUMENTS

| | | | |
|---|---|---|---|
| 4,438,291 | 3/1984 | Eichelberger et al. | 106/20 B |
| 4,462,827 | 7/1984 | Rellick | 252/514 |
| 4,466,830 | 8/1984 | Rellick | 252/514 |
| 5,376,403 | 12/1994 | Capote et al. | 252/514 |

FOREIGN PATENT DOCUMENTS

| | | | |
|---|---|---|---|
| 4218173 | 10/1992 | Germany. | |
| 53-25302 | 7/1978 | Japan | 75/252 |

*Primary Examiner*—George Wyszomierski
*Attorney, Agent, or Firm*—Griffin, Butler, Whisenhunt & Kurtossy

[57] ABSTRACT

A conductive ink for making a conductive wiring comprises first and second metal grains dispersed in an organic material. The second metal grains are interposed between the first metal grains and they have a melting temperature that lies between the melting temperature of the first metal grains and the setting temperature of the organic material.

3 Claims, 1 Drawing Sheet

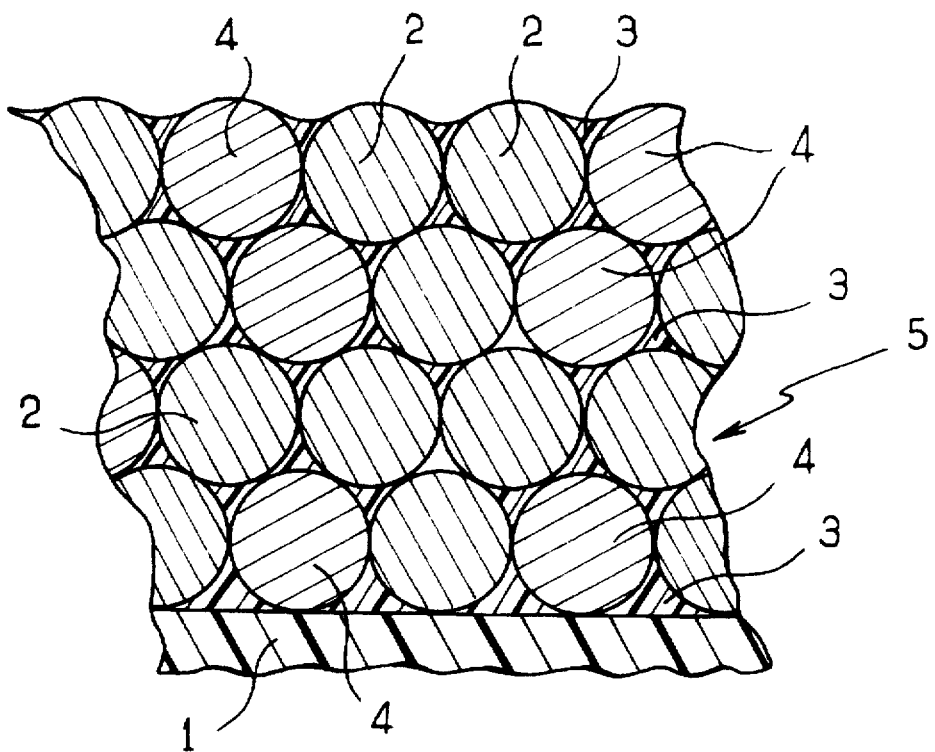
FIG_1
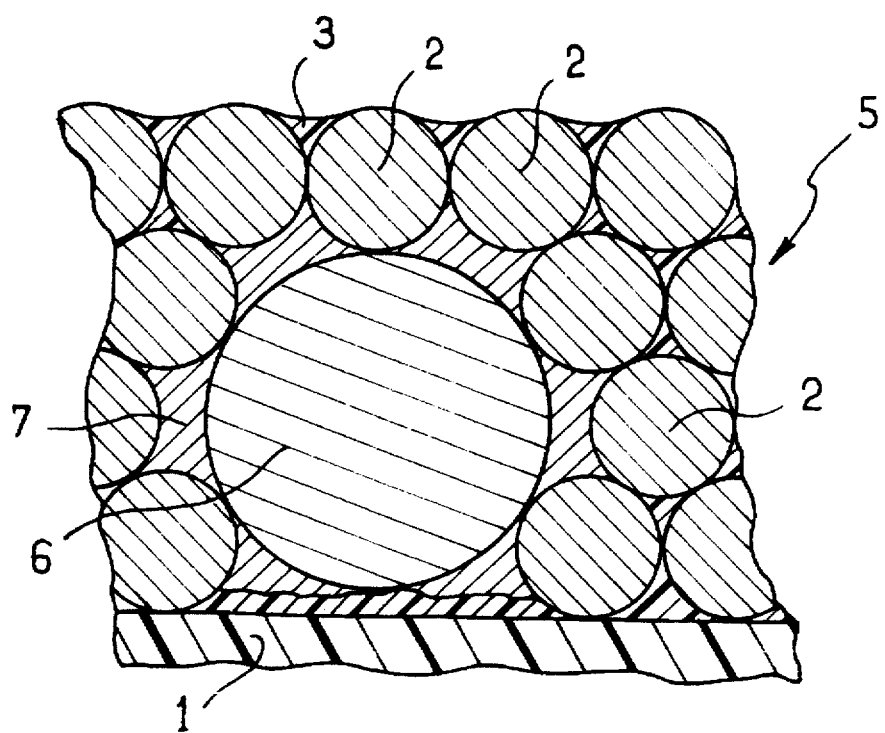
FIG_2

CONDUCTIVE INK

The present invention relates a conductive ink comprising grains of metal bonded together by an organic material, and also to a conductive wiring made using the ink.

BACKGROUND OF THE INVENTION

At present, conductive inks are used for making conductive wirings on a variety of insulating media, in particular on films or sheets of plastics material used for making electronics cards.

Prior to application, such inks include grains of metal, generally grains of silver which has a melting point that is high, which grains are dispersed in an organic material in the liquid phase. While it is being applied, the ink is raised to a temperature that causes the organic material to set, thereby connecting the metal grains together with or without evaporation of a portion of the liquid phase. The application temperature is generally about 70° C.

Because of the high melting temperature of the metal grains, it is very difficult to achieve local melting of the conductive ink in order to bond it with a component after the conductive ink has been deposited, or to interconnect two conductive wirings of different makeups implemented one after the other on a common substrate. A high temperature capable of melting the metal grains would damage the substrate which is generally made of a plastics material having a melting point that is lower than the melting point of the metal grains. Present inks therefore often give rise to electrical connections that are defective even though a wiring made of the conductive ink is physically in contact with a component or with another wiring.

OBJECTS AND SUMMARY OF THE INVENTION

The present invention seeks to remedy those drawbacks and to do so it provides a conductive ink which, after being deposited and hardened, is capable of being melted locally without significant damage to the substrate, thereby providing satisfactory electrical connection with a component or with another wiring.

According to the invention, there is provided a conductive ink comprising first metal grains dispersed in an organic material in the liquid phase, and second metal grains likewise dispersed in the organic material, the second metal grains having a melting temperature that lies between a melting temperature of the first metal grains and a setting temperature of the organic material.

Thus, while the conductive ink is being applied, the first and second metal grains remain in the solid state, and upon local heating of the conductive ink to a temperature equal to the melting temperature of the second metal grains, the second metal grains are caused to melt, thereby achieving an effective conductive connection with a component or with another wiring. In this context, it should be observed that since the second metal grains are interposed between the first metal grains and since they are heated only locally, a welding operation can be performed sufficiently quickly to avoid transmitting to the substrate a quantity of heat that would damage it.

Also, the volume occupied by the metal grains while they are packed in the solid state is greater than the corresponding volume of metal while in the molten state. The total volume of a segment of wiring after the second metal grains have been melted is therefore smaller than the total volume of the wiring prior to the welding operation. It has been observed that this reduction in volume gives rise to significant shear stresses in the body of the conductive ink.

According to an important aspect of the invention, the creation of stress is minimized by providing the second grains so that their volume lies in the range 10% to 40%, and preferably in the range 10% to 20% of the total volume of the metal grains. Volume reduction during melting of the second metal grains is thus minimized. This volume reduction is then compensated by inserting parts to be connected to the conductive wiring or by interpenetration of the ends of two interconnected wirings.

According to another aspect of the invention, the first and second metal grains are of substantially equal dimensions. This ensures that after transport and storage the first and second metal grains are not distributed in separate layers when the ink is applied.

BRIEF DESCRIPTION OF THE DRAWING

Other characteristics and advantages of the invention appear on reading the following non-limiting description given with reference to the figures, in which:

FIG. 1 is a section view through a conductive wiring made using an ink of the invention; and FIG. 2 is a fragmentary section view analogous to that of FIG. 1 after a wire has been inserted in the conductive wiring.

MORE DETAILED DESCRIPTION

In a manner known per se, the conductive ink of the invention includes first metal grains disposed in an organic material in the liquid phase. The first metal grains are made of silver, for example, and the organic material is, for example, a resin of the epoxy or polyester type. According to the invention, the conductive ink also includes second metal grains dispersed in the organic material, said second metal grains having a melting temperature lying between the melting temperature of the first metal grains and the setting temperature of the organic material. By way of example, the second metal grains are made of a metal selected from the group comprising lead, antimony, zinc, tin, an alloy of at least one of said metals, and an alloy of at least one of said metals and of selenium.

The melting point of the first metal grains is preferably higher than 900° C., whereas the melting point of the second metal grains is situated in the range 200° C. to 430° C. The metal constituting the second metal grains is preferably selected so that in the molten state it has good wettability relative to the first metal grains.

In order to prevent the first and second grains from occupying separate layers during storage or transport and indeed during application of the conducive ink, the first and second metal grains are preferably of substantially the same size, which size preferably lies in the range 0.6 μm to 6 μm. Because the densities of the metals constituting the various grains are very similar, random distribution of the grains can then be obtained merely by shaking the receptacle containing the conductive ink prior to application thereof.

The conductive ink of the invention is applied at a temperature below the melting temperature of the second metal grains, e.g. at a temperature of 70° C. in order to achieve setting of the organic material, either by polymerization or merely by solvent evaporation. After the conductive ink of the invention has been applied to a substrate 1, e.g. a substrate made of a plastics material, a conductive wiring is obtained as shown in FIG. 1 in which the first metal grains 2 are bonded together by the organic material 3 that has set, and the second metal grains 4 are interposed between the first metal grains 2 and are likewise bonded therewith by the organic material 3, the various metal grains being in contact with one another. The resulting continuous conductive wiring given overall reference 5 thus presents excellent conductivity.

When it is desired to fix a conductive wire 6 to the conductive wiring 5, the conductive wire 6 is placed on the conductive wiring and is then heated to a temperature that is greater than the melting temperature of the second metal grains. The metal grains are thus heated until the second metal grains 4 melt. The organic material is then softened so that the first metal grains are disunited from one another and allow the conductive wire 6 to pass between them. After cooling, the conductive wire 6 is connected to the adjacent metal grains 3 by a conductive metal mass 7 that is the result of the second metal grains 4 returning to the solid state, as shown in FIG. 2. The resulting connection thus has excellent conductivity even if a few particles of organic material are dispersed in the metal mass that results from melting the second grains.

When making a junction between two wirings, the conductive ink of the invention is melted in the junction zone of the two wirings so that the second metal grains that are locally melted therein ensure a connection between the first metal grains of the two adjacent wirings.

It may be observed that during a welding operation, some of the organic material is burned or sublimes under the effect of the heat, and the liquid metal obtained by melting the second metal grains tends to fill the interstices between the first metal grains. In order to minimize the reduction in the volume of the conductive wiring that results from a welding operation, the invention provides for the second metal grains to constitute a volume lying in the range 10% to 40% and preferably in the range 10% to 20% of the total volume of metal grains, particularly when the conductive ink of the invention is to be used for forming a conductive wiring that provides electrical contact with a metal surface.

Naturally, the invention is not limited to the embodiment described, and variant embodiments may be applied thereto without going beyond the ambit of the invention as defined in the claims.

Specifically, although the metal grains of the conductive ink of the invention are shown in the figures as being grains that are spherical, they could have any appropriate shape.

I claim:

1. A junction between a first conductive wiring on a plastic substrate and a conductive wire or a second conductive wiring, wherein said junction includes first metal grains embedded in a mass of a second metal having a melting temperature that is lower than a melting temperature of the first metal grains, while aside the junction at least the first conductive wiring includes first and second metal grains embedded in a polymer having a setting temperature lower than a melting temperature of the substrate.

2. A junction according to claim 1 wherein the second metal occupies a volume lying in the range 10% to 40% of the total volume of metal.

3. A junction according to claim 2 wherein the second metal occupies a volume lying in the range 10% to 20% of the total volume of metal.

* * * * *